United States Patent
Yamagata et al.

[11] Patent Number: 5,858,851
[45] Date of Patent: Jan. 12, 1999

[54] MANUFACTURING METHOD OF ELECTRODE

[75] Inventors: Satoru Yamagata, Tenri; Shigeo Onishi; Jun Kudo, both of Nara, all of Japan

[73] Assignee: Sharp Kabushiki Kaisha, Osaka, Japan

[21] Appl. No.: 722,678

[22] Filed: Sep. 30, 1996

[30] Foreign Application Priority Data

Mar. 19, 1996 [JP] Japan ................................. 8-062545

[51] Int. Cl.⁶ .............................................. H01L 21/8242
[52] U.S. Cl. ............................ 438/396; 438/3; 438/240; 438/253; 438/653
[58] Field of Search ................................ 257/310; 438/3, 438/240, 253, 396, 653, 770, 785

[56] References Cited

U.S. PATENT DOCUMENTS

| | | |
|---|---|---|
| 5,005,102 | 4/1991 | Larson . |
| 5,418,388 | 5/1995 | Okudaira et al. .................. 257/310 |
| 5,523,595 | 6/1996 | Takenaka et al. .................. 257/310 |
| 5,554,564 | 9/1996 | Nishioka et al. ................... 438/396 |
| 5,566,045 | 10/1996 | Summerfelt et al. ............... 438/240 |
| 5,593,914 | 1/1997 | Evans, Jr. et al. .................. 438/240 |
| 5,618,746 | 4/1997 | Hwang ................................... 438/3 |
| 5,663,088 | 9/1997 | Sandhu et al. ..................... 438/240 |
| 5,753,527 | 5/1998 | Itoh et al. .......................... 438/396 |

FOREIGN PATENT DOCUMENTS

04085878 A  3/1992  Japan .

Primary Examiner—Michael Trinh
Assistant Examiner—Toniae M. Thomas
Attorney, Agent, or Firm—Nixon & Vanderhye, P.C.

[57] ABSTRACT

A titanium film and a titanium nitride film are sequentially formed on a polysilicon plug. Next, the titanium nitride film is oxidized to form an oxidized titanium nitride film. Thereafter, a lower electrode and a PZT film are formed. A diffusion barrier layer is prepared from the oxidized titanium nitride film and is oxidized before the lower electrode is formed. As a result, unlike in prior art, the diffusion barrier layer is not oxidized after the lower electrode is formed. Peel-off between the diffusion barrier layer and the lower electrode due to the oxidation is thus prevented.

8 Claims, 4 Drawing Sheets

MANUFACTURING METHOD OF ELECTRODE

FIELD OF THE INVENTION

The present invention relates to a manufacturing method of an electrode especially suitably used for a capacitor having a ferroelectric film or a highly dielectric film, and more particularly for a semiconductor device such as a semiconductor memory element equipped with such a capacitor and a transistor for controlling charge and discharge of the capacitor.

BACKGROUND OF THE INVENTION

Recently, intensive studies have been made about semiconductor memory elements using a highly dielectric thin film of a high dielectric constant compared with a silicon oxide film, and about those using a ferroelectric thin film with spontaneous polarization. Highly dielectric materials typically include oxides such as Strontium Titanate (STO, $SrTiO_3$) and Barium/Strontium Titanate (BSTO, (Ba•Sr)$TiO_3$) Ferroelectric materials typically include oxides such as Lead Zirconate Titanate (PZT, Pb(Zr•Ti)$O_3$), Lead Titanate (Pb$TiO_3$), Barium Titanate (Ba$TiO_3$), Lead Lanthanum Zirconate Titanate (PLZT, (Pb•La) (Zr•Ti)$O_3$), and Bismuth Layered Oxides (BTO, $Bi_4Ti_3O_{12}$; $SrBi_2$ $(Ta_xNb_{1-x})_2O_9$). Especially, the mainstream study now is concerned with PZT and Bismuth Layered Oxide which seem to be the most promising materials for non-volatile memories.

Figure 7:
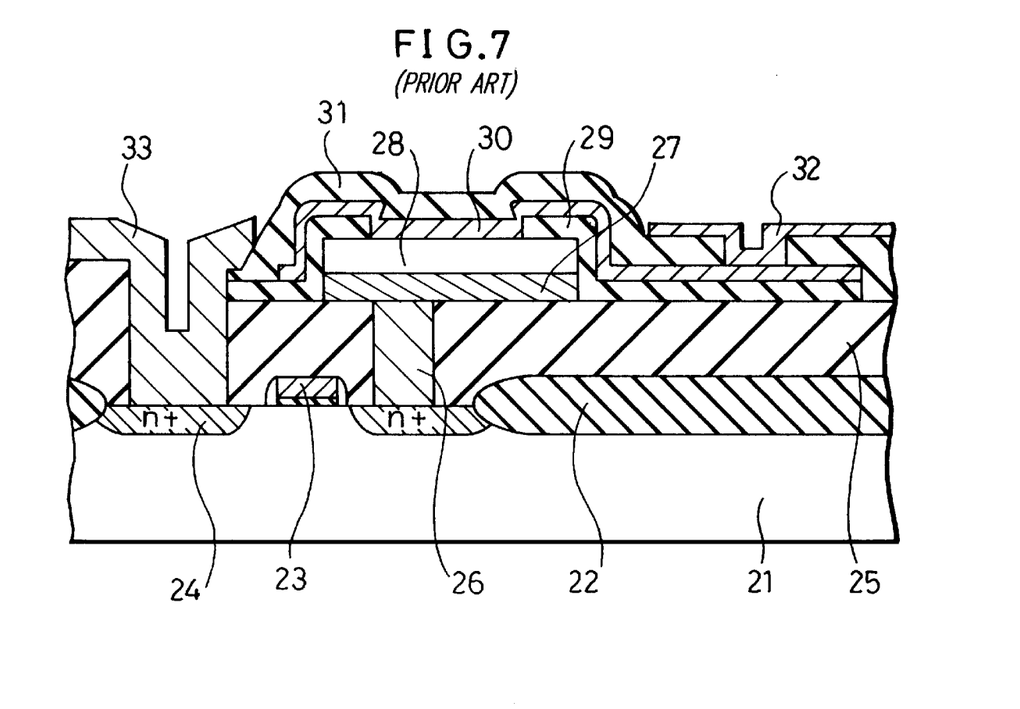
FIG. 7, illustrating a first conventional technique, is a cross-sectional view of a structure of a semiconductor memory element.

FIG. 7 is a cross-sectional view showing a structure of a first conventional semiconductor memory element. The semiconductor memory element using a conventional highly dielectric material or ferroelectric material for a dielectric film of a capacitor employs, as illustrated in FIG. 7, a stack type structure in which a capacitor composed of a lower electrode 27, a dielectric film 28 and an upper electrode 30 is formed on a selective transistor composed of a gate electrode 23 and source/drain areas 24. The structure reduces a memory cell area, thereby facilitating high integration. In order to realize such a stack type structure, wiring 26 connecting the selective transistor and the capacitor needs to have a plug structure. In FIG. 7, 21 is a semiconductor substrate (e.g., an n type silicon substrate); 22 is a LOCOS (Local Oxidation of Silicon) oxide film for separating elements; 25, 29 and 31 are interlayer insulating films; and 32 and 33 are wiring electrodes.

At present, polysilicon and tungsten are widely used as a material for a plug of a minute contact hole. Besides, platinum is used as a material for the lower electrode of the capacitor because of its resistance to oxidation and reaction.

In a process of forming the highly dielectric film or ferroelectric film used in the capacitor, a treatment in oxidizing atmosphere at a high temperature between 500° and 700° C. is essential to obtain the great dielectric constant or ferroelectricity by crystallization of these films. The highly integrated semiconductor memory element has problems, such as deteriorating transistor properties, in its application to practical use. Such deterioration is caused by (1) reaction between the platinum lower electrode of the capacitor and either the polysilicon plug or the tungsten plug at high temperatures during the dielectric film forming process, (2) poor contact due to oxidation of the plug, or (3) diffusion of lead, Bi, etc. in the platinum, the ferroelectric film, etc. These problems creates needs for a thermally stable conductive diffusion barrier layer having a strong barrier capability to oxygen, platinum, lead, Bi and the like to be disposed between the plug and the platinum lower electrode.

Figure 8:
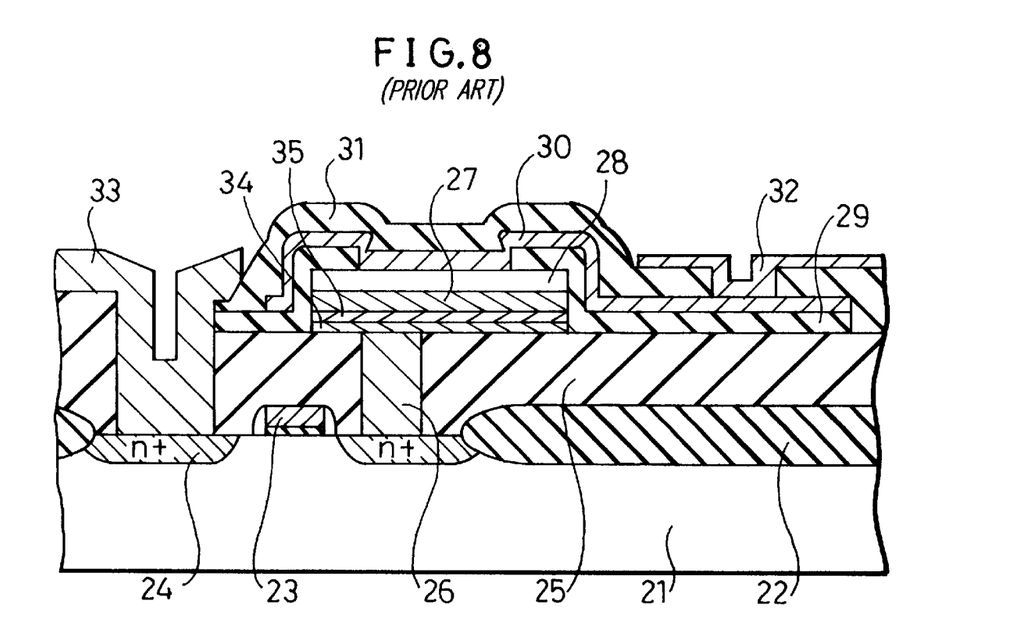
FIG. 8, illustrating a second conventional technique, is a cross-sectional view of a structure of a semiconductor memory element.

For example, in Official Gazette of United States Patent and Trademark Office U.S. Pat. No. 5,005,102, a titanium layer 34 and a titanium nitride layer 35 are used as the diffusion barrier layer as shown in FIG. 8. Nevertheless, if oxygen annealing is conducted at 600° C. in order to crystallize the dielectric film 28, the diffusion barrier layer is oxidized, thereby causing a stress change in the diffusion barrier layer. iIere occurs peel-off at an interface between the lower electrode and a TiN film to relieve this stress change. More specifically, the stress change results from a change of compressive stress due to volume expansion caused by oxidation of the TiN film during crystallization of a PZT film. For example, the TiN film has a tensile stress of about $5 \times 10^9$ dyne/$cm^2$ at room temperature.

Moreover, oxygen, lead, Bi, platinum, etc. diffuse through a grain boundary with ease because the titanium layer 34 and the titanium nitride layer 35 used as the diffusion barrier layer takes a column ar crystal structure. Therefor, the film thickness needs to be not less than 2000 Å to obtain enough barrier capability. This causes a greater stage difference in a capacitor area and hinders high integration. These are very serious problems in the application of the highly integrated semiconductor memory element into practical use.

Japanese Laid-Open Patent Application No. 4-85878/1992 (Tokukaihei 4-85878) discloses a configuration of using an ITO film as a lower electrode. Nonetheless, properties of the ITO film deteriorate at temperatures higher than 500° C. Especially at 600° C. where the ferroelectricity sinters, the ITO film has a problem of an increasing resistance.

SUMMARY OF THE INVENTION

An object of the present invention is to offer a manufacturing method of an electrode especially suitably used for a capacitor having a ferroelectric film or a highly dielectric film, and more particularly for a semiconductor device such as a semiconductor memory element equipped with such a capacitor and a semiconductor for controlling charge and discharge of the capacitor, that is, a manufacturing method of an electrode which restrains peel-off caused by oxidation of a diffusion barrier layer, has good adhesion with wiring, such as a polysilicon plug, and remarkable barrier capability.

A manufacturing method of an electrode in accordance with the present invention is a manufacturing method of an electrode including: an electrode part; and a conductive diffusion barrier layer, provided on a surface of the electrode part, for stopping impurities such as oxygen, platinum, Bi and lead from passing. Besides, in order to achieve the above object, the manufacturing method includes following processes: a first process of providing the diffusion barrier layer at least whose interface with the electrode part is composed of a metal nitride oxide; and a second process of providing, after the first process, the electrode part on the interface of the diffusion barrier layer.

With the arrangement, the interface of the diffusion barrier layer is an oxide at the time of the provision of the electrode part. Therefore, the interface is not oxidized anymore in heat treatment during, for example, crystallization of the highly dielectric film or the ferroelectric film. Since the interface is stable even in oxidizing atmosphere at a high temperature, the conventional problem (i.e., the peel-off between the electrode part and the diffusion barrier layer due to a stress change) can be prevented. As a result, the impurities are prevented from passing from the electrode part to the wiring such as a conductive plug, without causing inadequate contact to occur between the electrode part and the diffusion barrier layer.

The first process may be arranged in various manners. For example, the first process may include a process of forming a metal nitride oxide film which is to become the interface of the diffusion barrier layer with PVD method, CVD method, etc. This arrangement allows the diffusion barrier layer to be formed before the second process.

Another arrangement of the first process includes a process of forming a metal nitride film, such as a titanium nitride film, which is to become the interface of the diffusion barrier layer with, for example, magnetron reactive sputtering method, and a process of oxidizing at least the interface of the metal nitride film with, for example, high temperature treatment in oxidizing atmosphere. This arrangement also allows the diffusion barrier layer to be formed before the second process. Since at least the interface of the diffusion barrier layer with the electrode should be prepared from a metal nitride oxide film, the same effects can be obtained from oxidation of only a neighborhood of the interface.

No matter which arrangement is adopted to realize the first process, at least the metal nitride oxide formed on the interface as a result of the first process is preferably a titanium nitride oxide. Compared with, for example, a titanium nitride of a columnar crystal structure, the titanium nitride oxide has remarkable barrier capability to oxygen, lead, Bi, platinum, etc. because of its grain crystal structure. Therefore, desired barrier capability can be obtained with a thinner diffusion barrier layer. This improves integration of a circuit including the electrode.

Incidentally, the electrode formed with the above method is extremely suitable for use as the electrode of the capacitor having the dielectric film of the high dielectric constant or ferroelectric substance properties, such as a PZT film. In other words, a manufacturing method of such a capacitor preferably includes the first and second processes of the manufacturing method of an electrode, and further includes, after that second process, a third process of providing the dielectric film on the opposite side from the interface of the electrode part.

Even if treatment in high temperature oxidizing atmosphere between 500° and 700° C. is conducted during the formation of the dielectric film, this arrangement enables the dielectric film to be crystallized appropriately without causing a faulty contact at the electrode. Moreover, since the electrode can be made thin, the capacitor is also made thin as a whole. Consequently, the manufacturing method of a capacitor can produce the highly integrated capacitor having the highly dielectric film or the ferroelectric film.

Besides, the capacitor formed with the above method is especially suitable for use in a semiconductor device which includes a semiconductor, such as a transistor, for controlling charge and discharge of the capacitor. In other words, a manufacturing method of a semiconductor device preferably includes the first, second and third processes of the manufacturing method of a capacitor, and further includes a process of providing the semiconductor which is to be connected to the electrode part via the diffusion barrier layer.

Generally, properties of a semiconductor such as a transistor deteriorate if an impurity such as platinum, lead, Bi, etc. is mixed. Therefore, for example, if the capacitor and the semiconductor are connected via a conductive plug, a diffusion barrier layer interposed between an electrode part of the capacitor and the conductive plug is required to have good barrier capability, especially, to these impurities. Moreover, the diffusion barrier layer needs to have adhesion between the electrode part and the conductive plug (e.g., the polysilicon plug). Meanwhile, if a dielectric substance of the capacitor is to be formed, since treatment in oxidizing atmosphere at a high temperature is essential, the impurities are likely to diffuse, and it is difficult to maintain the adhesion due to the peel-off, etc. caused by the oxidation of the diffusion barrier layer.

Nevertheless, even if the dielectric film is appropriately crystallized, the manufacturing method of a semiconductor device can prevent the peel-off at the electrode caused by the oxidation of the diffusion barrier layer, and can maintain the good adhesion with the conductive plug. Consequently, it is possible to manufacture the highly reliable semiconductor device. Moreover, the titanium nitride oxide film formed on the interface of the diffusion barrier layer, because of its grain crystal structure, is thin, but still generates remarkable barrier capability to the impurities above. As a result, the semiconductor device of high integration provided with the ferroelectric film, the highly dielectric film, etc. can be realized. Therefore, the above mentioned manufacturing method of a semiconductor is especially suitable to a semiconductor device which needs high integration such as a semiconductor memory and a liquid crystal display device.

For a fuller understanding of the nature and advantages of the invention, reference should be made to the ensuing detailed description taken in conjunction with the accompanying drawings.

DESCRIPTION OF THE EMBODIMENT

The following description will discuss the present invention in detail by means of an embodiment.

In FIGS. 1 through 5, 1 is an n type silicon substrate; 2 is a LOCOS oxide film for separating elements disposed on a surface of the silicon substrate 1; 3 is a gate oxide film; 4 is a gate electrode; 5 is source/drain areas; 6 is a first silicon oxide film provided as an interlayer insulating film on the silicon substrate 1; 7 is a polysilicon plug provided for connecting the silicon substrate 1 and a platinum lower electrode 11; 8 is a titanium film for improving connection between the polysilicon plug 7 and a titanium nitride film 9; 9 is a titanium nitride film provided as a diffusion barrier layer; 10 is a film disposed on the polysilicon plug 7 as a diffusion barrier layer by oxidizing the titanium nitride film 9; 11 is a platinum lower electrode provided on the oxidized titanium nitride film 10; 12 is a PZT film, i.e., a ferroelectric film, provided on the platinum lower electrode 11; 13 is a second silicon oxide film provided as an interlayer insulating film; 14 is a platinum upper electrode provided on the PZT film 12; 15 is a third silicon oxide film provided as an interlayer insulating film; 16 is a first aluminum connecting electrode provided for being connected with the platinum upper electrode 14; and 17 is a second aluminum connecting electrode provided for being connected with the silicon substrate 1. Note that although the present embodiment adopts the n type silicon substrate 1, this does not limit the scope of the present invention.

Referring to FIGS. 1 through 5, the following description will discuss manufacturing processes of a semiconductor memory element of the embodiment in accordance with the present invention.

Figure 1:
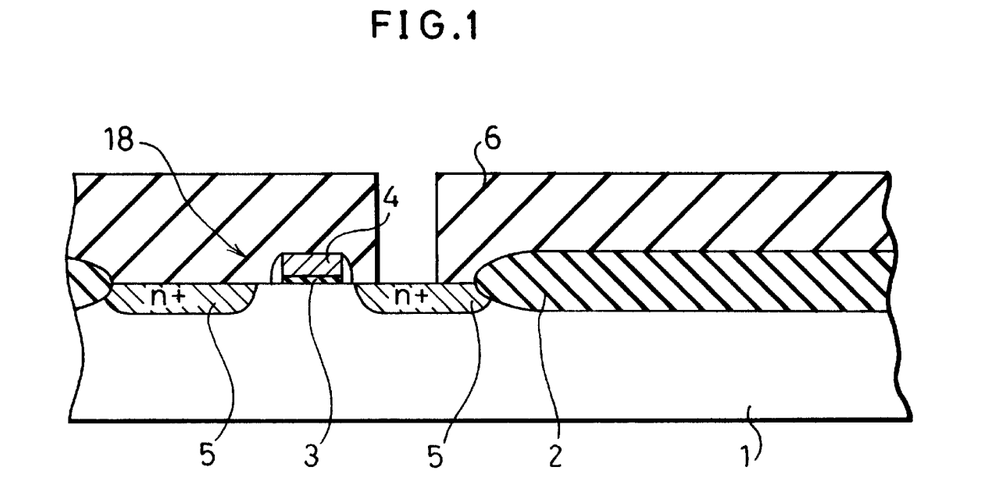
FIG. 1, showing a manufacturing process of a semiconductor memory element of an embodiment in accordance with the present invention, is a cross-sectional view of a structure in a state where a selective transistor is provided.

First, as shown in FIG. 1, an element separation area is provided by forming the LOCOS oxide film 2 having a thickness of about 5000 Å on the surface of the silicon substrate 1. Next, a selective transistor 18 composed of the gate oxide film 3, the gate electrode 4, the source/drain areas 5, etc. is provided. Then the first silicon oxide film 6 having a thickness of about 5000 Å is formed with CVD method as an interlayer insulating film. Next, a contact hole having a diameter of about 0.5 $\mu$m is formed. Then, the polysilicon plug 7 is provided by embedding polysilicon in the contact hole with CVD method, and then flattening the surface with CMP method.

Figure 2:
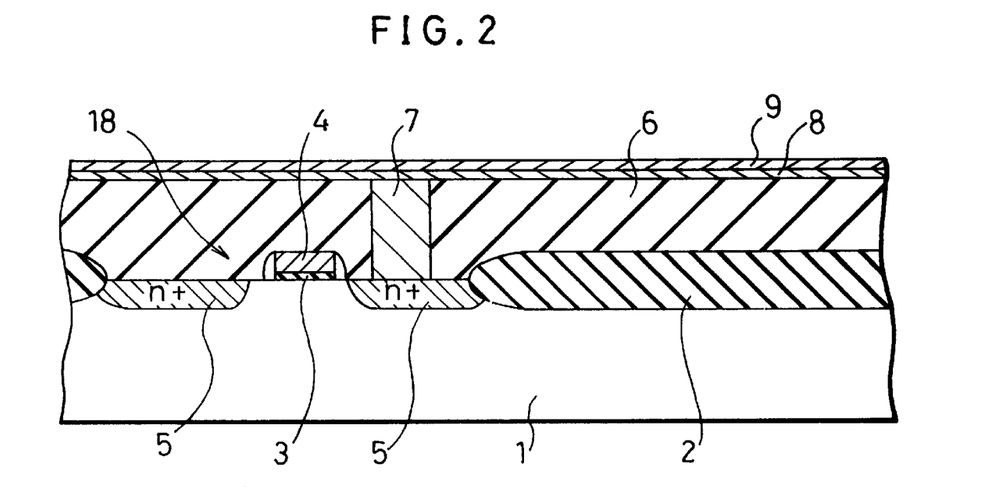
FIG. 2, showing a manufacturing process of the above semiconductor memory element, is a cross-sectional view of a structure in a process of oxidizing a titanium nitride film.

Next, as shown in FIG. 2, the titanium film 8 having a thickness of about 300 Å is formed on the polysilicon plug 7 with DC magnetron sputtering method, and then the titanium nitride film 9 having a thickness of about 1500 Å is formed with magnetron reactive sputtering method. Thereafter, the titanium nitride film 9 is oxidized with high temperature treatment in oxygen atmosphere to form the oxidized titanium nitride film 10.

Composition of the oxidized titanium nitride film 10 formed in the above process is expressed as $TiN_xO_y$. In this film forming process, first, the titanium nitride film 9 having a thickness of about 1500 Å is formed with magnetron reactive sputtering method. The film forming condition is set to 10 W/cm$^2$; the film forming pressure is set to 4 mTorr; and Ar:N$_2$=1:1. Next, the titanium nitride film 9 is oxidized with heat treatment of 500° to 700° C. with N$_2$:O$_2$=4:1. The composition of the oxidized titanium nitride film 10 can be changed by varying temperature, time, oxygen partial pressure, etc. FIG. 2 illustrates an example of oxidizing the entire titanium nitride film 9. Nonetheless, it is also possible to oxidize only a surface part of the titanium nitride film 9 with heat treatment. Such an arrangement can also solve the problems of, for example, the peel-off of the platinum lower electrode 11.

Figure 3:
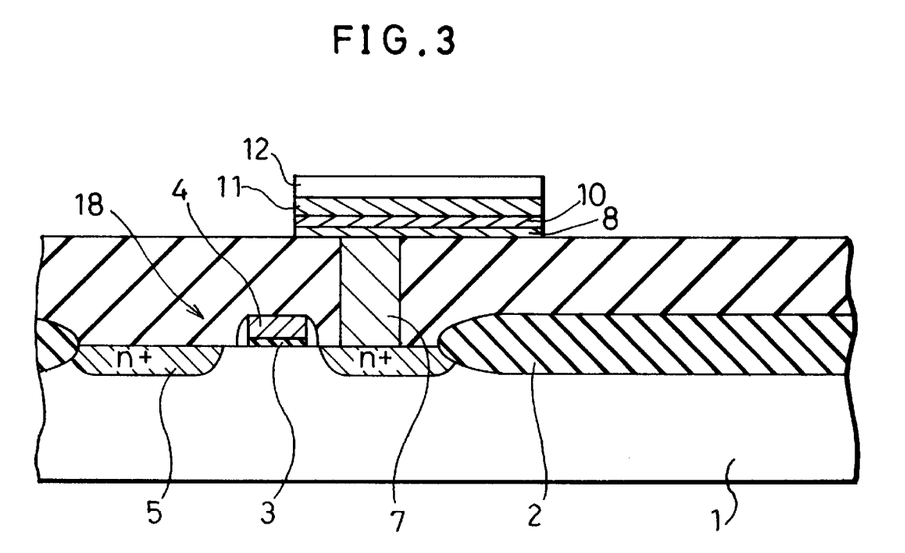
FIG. 3, showing a manufacturing process of the above semiconductor memory element, is a cross-sectional view of a structure in a process of providing a lower electrode and a dielectric film.

Next, as illustrated in FIG. 3, the platinum lower electrode 11 having a thickness of about 1000 Å is formed on the oxidized titanium nitride film 10 with DC magnetron sputtering method. Moreover, the PZT film 12 having a thickness of about 2000 Å is formed with sol-gel process. More specifically, sol-gel source solution is prepared by dissolving acetate, titanium (IV) isopropoxide and zirconium isopropoxide in 2-methoxyethanol as the solvent so that Pb:Ti:Zr= 100:52:48. The source solution is applied with a spinner at a rotation of 3000 rpm, and dried in the air for 10 minutes at 150° C. Thereafter, tentative sintering is carried out in the air for 30 minutes at 400° C. Then crystallization is carried out in nitrogen and oxygen mixture atmosphere for 30 minutes at 600° to 650° C. A flowing amount ratio of nitrogen to oxygen is set to 4. The PZT film 12 is generated in this manner.

Figure 4:
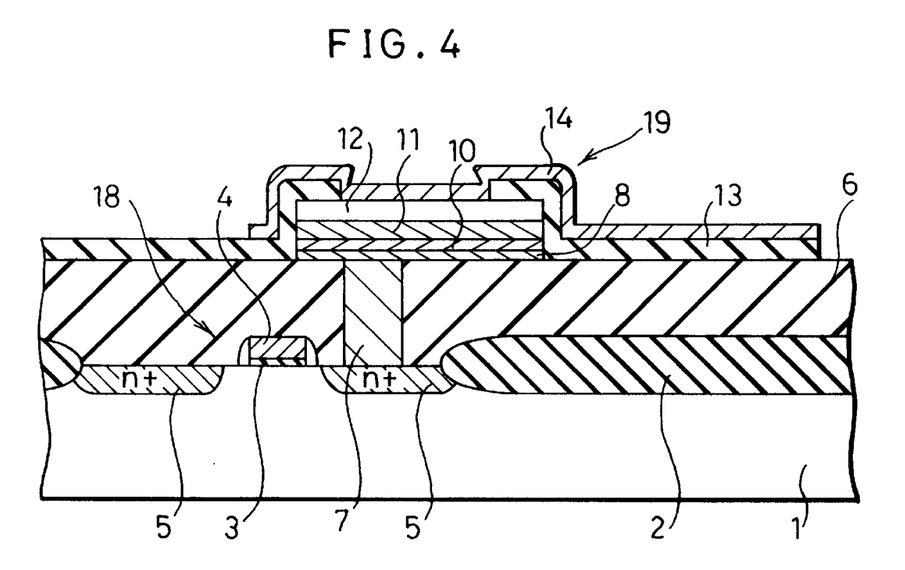
FIG. 4, showing a manufacturing process of the above semiconductor memory element, is a cross-sectional view of a structure in a process of providing an upper electrode.

Next, the PZT film 12, the platinum lower electrode 11 and the oxidized titanium nitride film 10 are processed with dry etching method to have a 2.6 $\mu$m×2.6 $\mu$m square shape. Thereafter, as illustrated in FIG. 4, the second silicon oxide film 13 which is to become the interlayer insulating film is formed with CVD method. Besides, after a contact hole is formed, the platinum upper electrode 14, having a thickness of about 1000 Å, of a ferroelectric capacitor 19 is formed with DC magnetron sputtering method.

Figure 5:
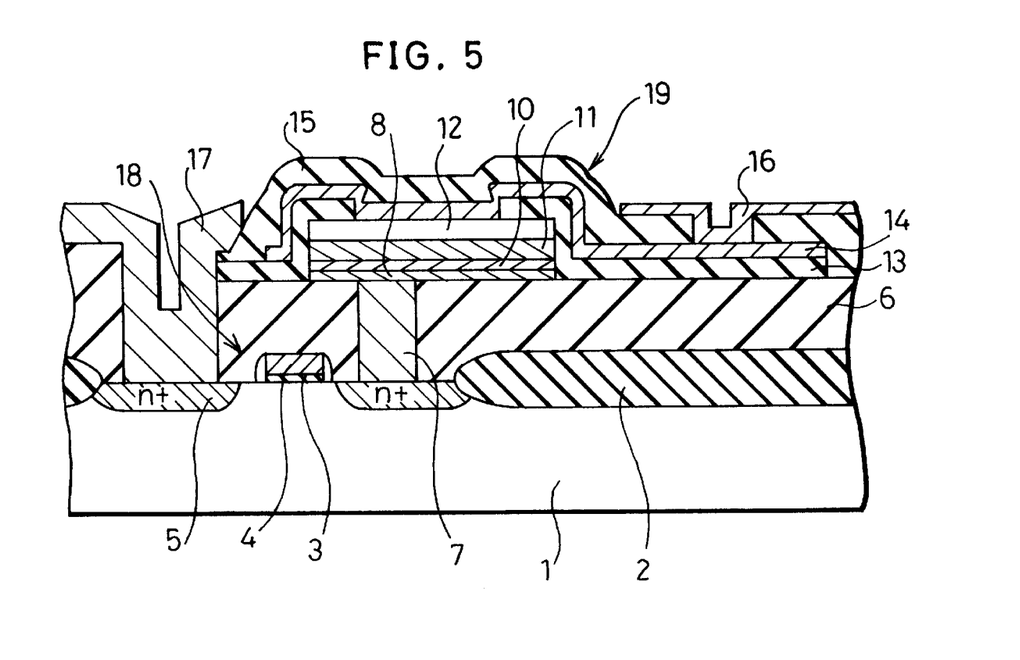
FIG. 5, showing a manufacturing process of the above semiconductor memory element, is a cross-sectional view of a structure of the semiconductor memory element already provided with a connecting electrode.

Next, as illustrated in FIG. 5, the platinum upper electrode 14 is processed with dry etching method using chlorine gas, and meanwhile the third silicon oxide film 15 is formed with CVD method so as to cover the platinum upper electrode 14. Thereafter, the contact holes are formed, and the aluminum connecting electrode 16 from the platinum upper electrode 14 of the ferroelectric capacitor 19, and the aluminum connecting electrode 17 from the silicon substrate 1 are formed with DC magnetron sputtering method.

The following description will discuss characteristics of the capacitor 19 having a ferroelectric film prepared in the above process.

Figure 6:
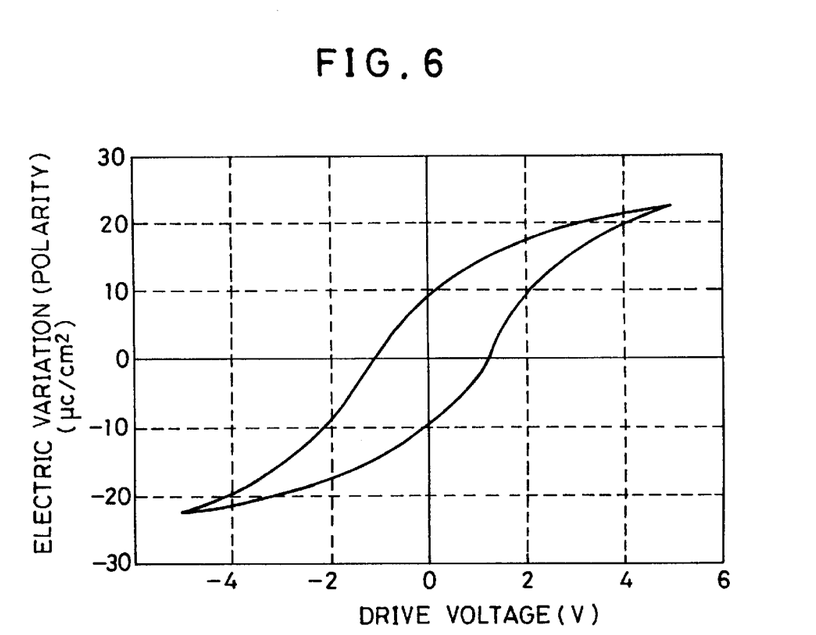
FIG. 6 is a graph showing a hysteresis loop followed by the above semiconductor memory element.

First, a hysteresis loop obtained from the capacitor 19 is measured by applying a chopping wave of 5 V, 75 Hz across the aluminum connecting electrode 16 from the platinum upper electrode 14 and the aluminum connecting electrode 17 from the silicon substrate 1. As illustrated in FIG. 6, the capacitor 19 shows ferroelectricity strong enough for use as a ferroelectric capacitor, and its symmetric property is maintained in the hysteresis loop. This confirms that the contact between the silicon substrate 1 and the platinum lower electrode 11 is solid.

Direct measurement of a contact resistance between the silicon substrate 1 and the platinum lower electrode 11 shows that the contact resistance is almost equal to the resistance before the PZT film 12 is formed (about 100 $\Omega$), indicating that there is no default contact occurring. The contact resistance is measured in the following manner. After the PZT film 12 is formed in the above explained manner, the PZT film 12 is removed with hydrofluoric acid to form an connecting electrode (not shown) from the platinum lower electrode 11. Then, the contact resistance, i.e., a resistance between that connecting electrode and the connecting electrode 17 from the silicon substrate 1, is measured.

The above mentioned embodiment employs sol-gel process to form the dielectric film. Nevertheless, there are alternative methods of forming the dielectric film, including vacuum evaporation method, reactive magnetron sputtering method and MOCVD method. In addition, the present embodiment employs the PZT film as the ferroelectric thin film. Nevertheless there are alternatives: for example, $PbTiO_3$, $(Pb_xLa_{1-x})$ $TiC_3$, $(Pb_xLa_{1-x})$ $(Zr_yTi_{1-y})O_3$, $BaTiO_3$, $BaMgF_4$, $LiNbO_3$, $LiTaO_3$, $YMnO_3$, $Sr_2Nb_2O_7$ and Bi layered oxides such as $Bi_4Ti_3O_{12}$, $SrBi_2Ti_2O_9$, $SrBi_2(Ta_xNb_{1-x})_2O_9$ and $Bi_4Ti_3O_{12}$. Also, $(Ba_xSr_{1-x})$ $TiO_3$, $SrBi_4Ti_4O_{15}$, etc. may be also used as the highly dielectric thin film. No matter which material is used for the dielectric film, enough diffusion barrier effect can be obtained in the same manner as the present embodiment by manufacturing the diffusion barrier layer (the oxidized titanium nitride film 10) and the platinum lower electrode 11 with the manufacturing method of the present embodiment.

Moreover, although the present embodiment employs platinum as the material for the lower electrode, other metals, nitrides and conductive oxides such as $RuO_2$ and $IrO_2$ also produce the same effects. In addition, apart from the polysilicon, other materials including tungsten may be used for the contact plug and still produce the same effects. Besides, although the oxidized titanium nitride is used as the diffusion barrier layer, a TiON film formed with PVD method, CVD method, etc. produces the same effects.

The manufacturing method of an electrode in accordance with the present invention is, as illustrated in FIGS. 1 through 5, a manufacturing method of the electrode including: the electrode part (platinum lower electrode 11); and the conductive diffusion barrier layer (oxidized titanium nitride film 10), provided on the surface of the electrode part, for stopping impurities such as oxygen, platinum, Bi and lead from passing. Besides, the manufacturing method includes the first process, illustrated in FIG. 2, of providing the diffusion barrier layer at least whose interface with the electrode part is composed of the metal nitride oxide, and the second process, illustrated in FIG. 3, of providing the electrode part on the interface of the diffusion barrier layer after the first process.

With the arrangement, the interface of the diffusion barrier layer is an oxide at the time of the provision of the electrode part. Therefore, the interface is not oxidized anymore in heat treatment during, for example, the crystallization of the highly dielectric film or the ferroelectric film. Since the interface is stable even in oxidizing atmosphere at a high temperature, the conventional problem (i.e., the peel-off between the electrode part and the diffusion barrier layer due to the stress change) can be prevented. As a result, the impurities are prevented from passing from the electrode part to the wiring such as the conductive plug, without causing inadequate contact to occur between the electrode part and the diffusion barrier layer.

The first process may be arranged in various manners. For example, the first process may include the process of forming the metal nitride oxide film which is to become the interface of the diffusion barrier layer with PVD method, CVD method, etc. This arrangement allows the diffusion barrier layer to be formed before the second process.

Another arrangement of the first process includes the process of forming the metal nitride film, such as the titanium nitride film 9, which is to become the interface of the diffusion barrier layer with, for example, magnetron reactive sputtering method, and the process of oxidizing at least the interface of the metal nitride film with, for example, high temperature treatment in oxidizing atmosphere. This arrangement also allows the diffusion barrier layer to be formed before the second process. Since at least the interface of the diffusion barrier layer with the electrode should be prepared from the metal nitride oxide film, the same effects can be obtained from oxidation of only a neighborhood of the interface.

No matter which arrangement is adopted to realize the first process, at least the metal nitride oxide formed on the interface as a result of the first process is preferably the titanium nitride oxide. Compared with, for example, the titanium nitride of a columnar crystal structure, the titanium nitride oxide has the remarkable barrier capability to oxygen, lead, Bi, platinum, etc. because of its grain crystal structure. Therefore, desired barrier capability can be obtained with a thinner diffusion barrier layer. This improves integration of a circuit including the electrode.

Incidentally, the electrode formed with the above method is extremely suitable for use as the electrode of the capacitor 19 having the dielectric film of the high dielectric constant or ferroelectric substance properties, such as the PZT film 12. In other words, the manufacturing method of such a capacitor preferably includes the first and second processes of the manufacturing method of an electrode, and further includes, after that second process, the third process, illustrated in FIG. 3, of providing the dielectric film on the opposite side from the interface of the electrode part.

When the capacitor is manufactured, the dielectric film must be treated in high temperature oxidizing atmosphere between 500° and 700° C. so as to be provided with the high dielectric constant, the ferroelectricity, etc. Meanwhile, the electrode manufactured with the above method is stable in high temperature treatment. Therefore, the above manufacturing method enables the dielectric film to be crystallized appropriately without causing a faulty contact at the electrode during the formation of the dielectric film. Moreover, since the electrode can be made thin, the capacitor is also made thin as a whole. Consequently, the manufacturing method of a capacitor can produce the highly integrated capacitor having the highly dielectric film or the ferroelectric film.

Besides, the capacitor formed with the above method is especially suitable for use in a semiconductor device which includes the semiconductor, such as the transistor (selective transistor 18), for controlling charge and discharge of the capacitor. In other words, the manufacturing method of a semiconductor device preferably includes the first, second and third processes of the manufacturing method of a capacitor, and further includes the process, illustrated in FIG. 1, of providing the semiconductor which is to be connected to the electrode part via the diffusion barrier layer.

Generally, properties of a semiconductor such as a transistor deteriorate if an impurity such as platinum, lead, Bi, etc. is mixed. Therefore, for example, if the capacitor and the semiconductor are connected via the conductive plug (polysilicon plug 7), the diffusion barrier layer interposed between the electrode part of the capacitor and the conductive plug is required to have good barrier capability, especially, to these impurities. Moreover, the diffusion barrier layer needs to have adhesion between the electrode part and the conductive plug (e.g., the polysilicon plug). Meanwhile, if a dielectric substance of the capacitor is to be formed, since treatment in oxidizing atmosphere at a high temperature is essential, the impurities are likely to diffuse, and it is difficult to maintain the adhesion due to the peel-off, etc. caused by the oxidation of the diffusion barrier layer.

Nevertheless, even if the dielectric film is appropriately crystallized, the manufacturing method of a semiconductor device can prevent the peel-off at the electrode caused by the oxidation of the diffusion barrier layer, and can maintain the good adhesion with the conductive plug. Consequently, it is possible to manufacture the highly reliable semiconductor device. Moreover, the titanium nitride oxide film formed on the interface of the diffusion barrier layer, because of its grain crystal structure, is thin, but still generates the remarkable barrier capability to the impurities above. As a result, the semiconductor device of high integration provided with the ferroelectric film, the highly dielectric film, etc. can be realized. Therefore, the above mentioned manufacturing method of a semiconductor is especially suitable to a semiconductor device which needs high integration such as a semiconductor memory and a liquid crystal display device.

The invention being thus described, it will be obvious that the same may be varied in many ways. Such variations are not to be regarded as a departure from the spirit and scope of the invention, and all such modifications as would be obvious to one skilled in the art intended to be include within the scope of the following claims.

What is claimed is:

1. A method of manufacturing an electrode including:

an electrode part; and a conductive diffusion barrier layer, provided on a surface of the electrode part for stopping an impurity from passing, said method comprising the steps of:

providing the diffusion barrier layer at least whose interface with the electrode part is composed of a metal nitride film;

(1) providing a peeling prevention film for preventing peeling of the electrode part and the diffusion barrier layer, by oxidizing a contact surface of the metal nitride film and the electrode part; and (2) providing, after the step (1), the electrode part on the interface of the diffusion barrier layer.

2. The method of manufacturing the electrode as defined in claim 1, wherein the metal nitride film is a titanium nitride film.

3. A method of manufacturing a capacitor including:

an electrode having an electrode part, and a conductive diffusion barrier layer provided on a surface of the electrode part for stopping an impurity from passing; and a dielectric film provided on another surface of the electrode part having ferroelectric properties or a high dielectric constant, said method comprising the steps of:

providing the diffusion barrier layer at least whose interface with the electrode part is composed of a metal nitride film;

(1) providing a peeling prevention film for preventing peeling of the electrode part and the diffusion barrier layer, by oxidizing a contact surface of the metal nitride film and the electrode part;

(2) providing, after the step (1), the electrode part on the interface of the diffusion barrier layer; and (3) providing, after the step (2), the dielectric film on a side opposite the interface of the electrode part.

4. A method of manufacturing a semiconductor device comprising:

a capacitor including an electrode having an electrode part, and a conductive diffusion barrier layer provided on a surface of the electrode part for stopping an impurity from passing, and said capacitor including a dielectric film provided on another surface of the electrode part having ferroelectric properties or a high dielectric constant; and a semiconductor material for controlling charge and discharge of the capacitor, said method comprising the steps of:

providing the diffusion barrier layer at least whose interface with the electrode part is composed of a metal nitride film;

(1) providing a peeling prevention film for preventing peeling of the electrode part and the diffusion barrier layer, by oxidizing a contact surface of the metal nitride film and the electrode part;

(2) providing, after step (1), the electrode part on the interface of the diffusion barrier layer;

(3) providing, after the step (2), the dielectric film on a side opposite the interface of the electrode part; and (4) providing the semiconductor which is to be connected to the electrode part via the diffusion barrier layer.

5. A method of manufacturing an electrode, comprising the steps of:

providing an electrode part;

providing a conductive diffusion barrier layer on a surface of the electrode, said conductive diffusion barrier layer preventing an impurity from passing therethrough, an interface of said diffusion barrier layer and said electrode part comprising a metal nitride film;

oxidizing a contact surface of said metal nitride film and the electrode part to provide a peeling prevention film, said peeling prevention film preventing peeling of the electrode part from the diffusion barrier layer; and providing the electrode part on the interface of the diffusion barrier layer after the oxidizing step.

6. A method of manufacturing a capacitor, comprising the steps of:

providing an electrode comprising an electrode part and a conductive diffusion barrier layer provided on a surface of the electrode part, said diffusion barrier layer preventing an impurity from passing therethrough, and whose interface with said electrode part comprises a metal nitride film;

providing a dielectric film on another surface of the electrode part, said dielectric film having at least one of a high dielectric constant and ferroelectric properties;

oxidizing a contact surface of the metal nitride film and the electrode part to form a peeling prevention film, said peeling prevention film preventing peeling between the electrode part and the diffusion barrier layer;

disposing the electrode part on the interface of the electrode and the diffusion barrier layer after said oxidizing step; and disposing the dielectric film on the side opposite the interface of the electrode part.

7. A method of manufacturing a semiconductor device, comprising the steps of:

forming a capacitor comprising an electrode including an electrode part and a conductive diffusion barrier layer provided on a surface of the electrode part, said diffusion barrier layer preventing an impurity from passing therethrough, an interface of said diffusion barrier layer with said electrode part comprising a metal nitride film, the capacitor having a dielectric film disposed on another surface of the electrode part, said dielectric film having at least one of a high dielectric constant and ferroelectric properties;

oxidizing a contact surface of the metal nitride film and the electrode part to form a peeling prevention film for preventing peeling between the electrode part and the diffusion barrier layer;

disposing the electrode part on the interface of the diffusion barrier layer and the electrode after the oxidizing step;

disposing the dielectric film on a side opposite the interface of the electrode part; and connecting the semiconductor device to the electrode part via the diffusion barrier layer.

8. A method of manufacturing an electrode, comprising the steps of:

forming an electrode part;

forming a conductive diffusion barrier layer on a surface of the electrode part, said diffusion barrier layer having an interface with the electrode part comprising a metal nitride film;

oxidizing a contact surface of the metal nitride film and the electrode part to form a peeling prevention layer; and disposing the electrode part on the interface of the diffusion barrier layer after the oxidizing step.

* * * * *